May 24, 1966 D. E. NELSON 3,253,233

HIGH FREQUENCY NEGATIVE RESISTANCE CIRCUIT INCLUDING A VOLTAGE CONTROLLED NEGATIVE RESISTANCE DEVICE

Filed Sept. 4, 1963 2 Sheets-Sheet 1

INVENTOR.
DONALD E. NELSON
BY Eugene M. Whitacre

HIGH FREQUENCY NEGATIVE RESISTANCE CIRCUIT INCLUDING A VOLTAGE CONTROLLED NEGATIVE RESISTANCE DEVICE

Filed Sept. 4, 1963 2 Sheets-Sheet 2

INVENTOR.
DONALD E. NELSON
BY Eugene M. Whitacre
Attorney

United States Patent Office 3,253,233
Patented May 24, 1966

3,253,233

HIGH FREQUENCY NEGATIVE RESISTANCE CIRCUIT INCLUDING A VOLTAGE CONTROLLED NEGATIVE RESISTANCE DEVICE

Donald E. Nelson, Kendall Park, N.J., assignor to Radio Corporation of America, a corporation of Delaware Filed Sept. 4, 1963, Ser. No. 306,426
6 Claims. (Cl. 331—107)

This invention relates to high frequency negative resistance circuits and more particularly to high frequency negative resistance oscillator circuits embodying tunnel diodes as the active element.

Tunnel diodes, which are a form of a negative resistance element, are specially suited for high frequency operation. When operated at microwave frequencies, it is desirable to utilize distributed circuits such as transmission line resonators, rather than lumped circuit elements to prevent excessive circuit losses. To bias a tunnel diode for stable operation in its negative resistance region, a voltage source which presents a direct current (D.-C.) resistance to the tunnel diode that is less than the absolute value of the minimum negative resistance of the diode is required. The voltage source may include a voltage divider with a suitable biasing resistor connected in parallel with the tunnel diode. Prior circuits have included the biasing resistor connected between the conductors of a straight transmission line at a voltage minimum point at the mean operating frequency so that the resistor has a minimum loading effect on the alternating current (A.-C.) circuit. However, some loading does occur since the biasing resistance dissipates some small amount of A.-C. wave energy which might otherwise be transferred to an output or utilization circuit.

If a re-entrant transmission line structure is employed, and the biasing resistance is coupled to the transmission line at a point such that the distance between the negative resistance device and the resistor in one direction minus the distance between them in the other direction is equal to one-half of the wave length at the selected mean operating frequency, then the biasing resistor presents little or no loading on the negative resistance device throughout a broad band of frequencies centered on the mean operating frequency of the circuit.

The selection of the frequency of oscillation was accomplished heretofore by means of variable capacitors connected to the transmission line at a place near the tunnel diode. The disadvantage encountered with capacitor tuning is that the tunable frequency range may include points in which the oscillator does not provide the desired frequency output, points of discontinuity. Additionally, once such an oscillator circuit has been successfully designed for a particular tunnel diode, replacement of the tunnel diode by another similar diode may again introduce an uncompensated discontinuity. A further disadvantage encountered with this kind of tuning is that the power output decreases with increases of frequency.

Accordingly, it is an object of this invention to provide an improved high frequency negative resistance oscillator circuit.

It is another object of this invention to provide an improved high frequency negative resistance diode oscillator circuit, tunable over a broad band, having continuous output throughout the frequency range of operation.

It is still another object of this invention to provide an improved high frequency oscillator circuit, having a broad frequency range and substantially constant power output throughout the frequency range of operation. A high frequency oscillator circuit in accordance with the invention includes a transmission line structure including a pair of parallel conductors. One of the conductors is U-shaped. A voltage controlled negative resistance device is connected between the transmission line conductors as the active element in the circuit. A bias stabilizing resistor whose resistance, in combination with other positive resistance present in the circuit, is smaller than the absolute value of the minimum negative resistance of the negative resistance device, is coupled to the transmission line conductors at a selected arcuate distance spaced from the negative resistance device. Circuit means are coupled to the transmission line to apply a bias voltage to the negative resistance device so that the device exhibits a negative resistance.

A sliding conductor is connected to the arms of the U-shaped conductor in a manner such that it slides along the arms of the conductor to provide a closed loop thereby providing in effect a variable length re-entrant transmission line as a function of the position of the sliding conductor. The effective mean circumference along the U-shaped conductor and hence of the transmission line determines the frequency of oscillation of the circuit; the mean circumference along the transmission line being equal to one full wave length at the frequency of operation.

The novel features that are considered characteristic of this invention are set forth in particularity in the appended claims. The invention itself, however, both to its organization and operation as well as additional objects and advantages thereof, will best be understood from the following description when read in connection with the accompanying drawings, in which:

Figure 5C:
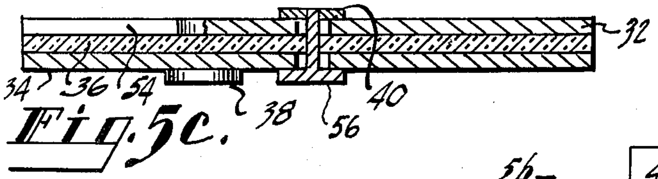
Figures 5A, 5B:
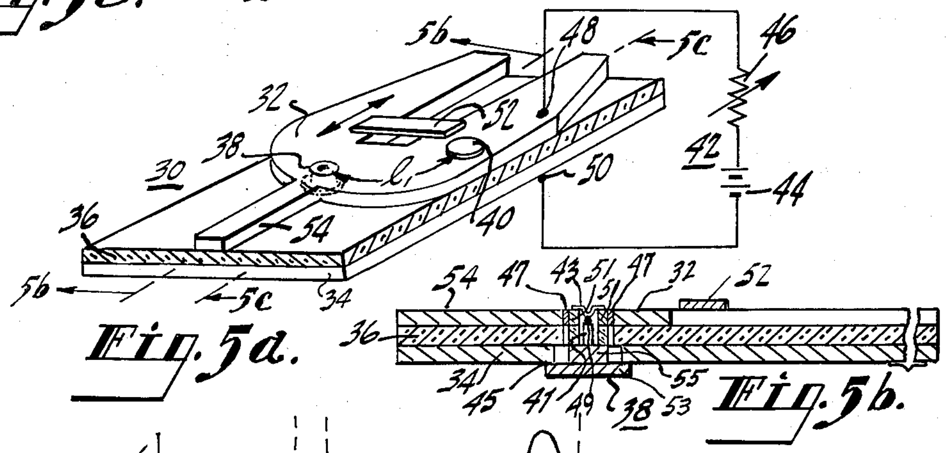
Figure 6:
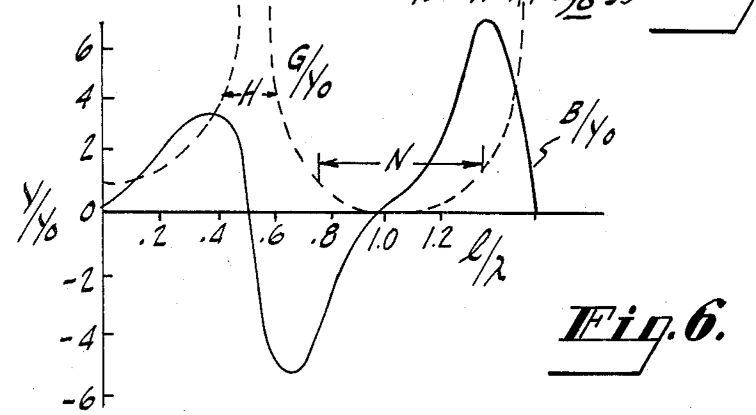
Figure 7:
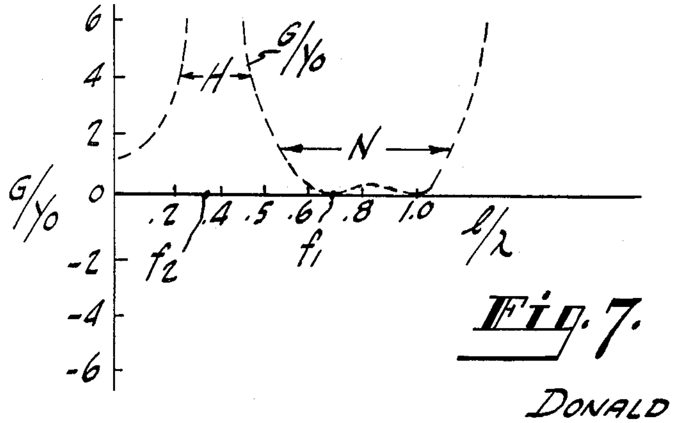

FIGURE *5a* is a perspective view of a high frequency negative resistance diode oscillator circuit in accordance with the invention, with the biasing source shown in schematic form;

FIGURE *5b* is a cross sectional view taken along line $5_b$—$5_b$ of FIGURE *5a*;

FIGURE *5c* is a cross sectional view taken along line $5_c$—$5_c$ of FIGURE *5a*;

FIGURE 6 is a graph diagrammatically illustrating the normalized admittance and conductance characteristics of the circuit shown in FIGURE 5 when the arcuate distance between the tunnel diode and the biasing resistor is equal to one-quarter of the mean circumference $l$; and FIGURE 7 is a graph diagrammatically illustrating the normalized conductance characteristic of the circuit shown in FIGURE 5 when the biasing resistor is connected an arcuate distance, with respect to the tunnel diode, which is smaller than one-quarter of the mean circumference $l$.

Figure 1:
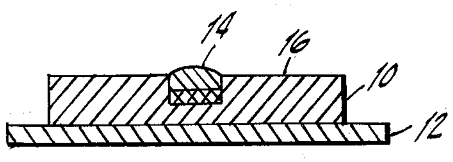
FIGURE 1 is a sectional view of a typical negative resistance diode which may be used in the circuit embodying the invention.

Reference is now made to the drawing, wherein like components in the various figures thereof have been given like reference numerals, and particularly to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages, i.e., less than 0.3 volt. The diode was prepared with a semiconductor having a free charge carrier concentration several orders of magnitude higher than that used in conventional diodes.

A diode which was constructed and may be used in the circuit of FIGURE 5*a*, includes a single crystal bar of N-type germanium which is doped with arsenic to have a donor concentration of $4.0 \times 10^{19}$ cm.$^{-3}$ by methods known in the semiconductor art. This device may be made, for example, by pulling a crystal from molten germanium containing the requisite concentration of arsenic. A wafer 10 is cut from the bar along the 111 plane, i.e., a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 percent by weight gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. Where the device is to be used at high frequencies, contact may be made to the dot with a low impedance lead.

Other semiconductors may be used instead of germanium, particularly silicon and the III–V compounds. A III–V compound is a compound composed of an element from Group III and Group V of the Periodic Table of Chemical Elements, such as gallium arsenide, indium arsenide and indium antimonide. Where III–V compounds are used, the p and n type impurities ordinarily used in those compounds are also used to form the diode described. Thus, sulfur is a suitable n-type impurity and zinc is a suitable p-type impurity which is also suitable for alloying.

Figure 2:
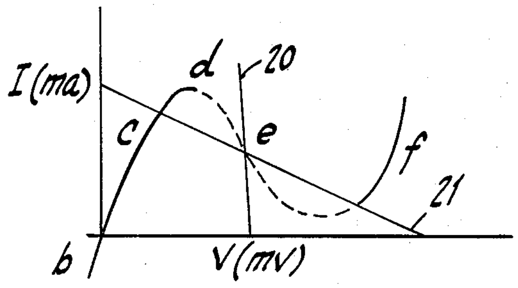
FIGURE 2 is a graph illustrating the current-voltage characteristic of the negative resistance diode shown in FIGURE 1.

The current-voltage characteristic of a typical diode suitable for use with circuits embodying the invention is shown in FIGURE 2. The current scales depend on area and doping of the junction.

For a small voltage in the back direction, the back current of the diode increases as a function of voltage as is indicated by the region *b* of FIGURE 2.

For small forward bias voltages, the characteristic is substantially linear (FIGURE 2, region *c*). The forward current results due to quantum mechanical tunneling. At higher forward bias voltages, the forward current reaches a maximum (region *d*, FIGURE 2), and then begins to decrease. This drop continues (FIGURE 2, region 3) until eventually normal injection over the barrier becomes dominant and the characteristic turns into the usual forward behavior (region *f*, FIGURE 2).

The negative resistance of the diode is the incremental change in voltage divided by the incremental change in current, or the reciprocal slope of the region *e* of FIGURE 2. To bias the diode for stable operation in the negative resistance region of its characteristic requires a suitable voltage source having a smaller internal impedance than the negative resistance of the diode. Such a voltage source has a D.-C. load line 20 as indicated in FIGURE 2, which is characterized by a current-voltage relationship, which has a steeper slope than the negative slope of the diode characteristic and intersects the diode characteristic at only one point. If the voltage source has an internal resistance which is greater than the negative resistance of the diode, the source would have a load line 21 with a smaller slope than the negative slope of the diode characteristic as indicated in FIGURE 2, and would intersect the diode characteristic curve at three points. Under the latter conditions the diode is not stably biased in the negative resistance region. This lack of stability is because an incremental change in current through the diode due to transient or noise currents or the like produces a regenerative reaction which causes the diode to assume one of its two stable states represented by the extreme intersections of the load line 21 with the positive resistance portions of the diode characteristic curve.

Figure 3:
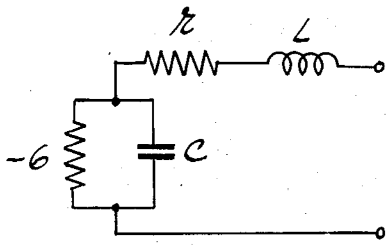
FIGURE 3 is an equivalent schematic circuit diagram of a typical encapsulated negative resistance diode.

The equivalent circuit of a packaged or encapsulated tunnel diode which is biased to an operating point in the negative resistance region is shown in FIGURE 3. Here −G is the negative conductance of the diode, C the junction capacitance, *r* the dissipative resistance and L the package or capsule inductance.

Figure 4:
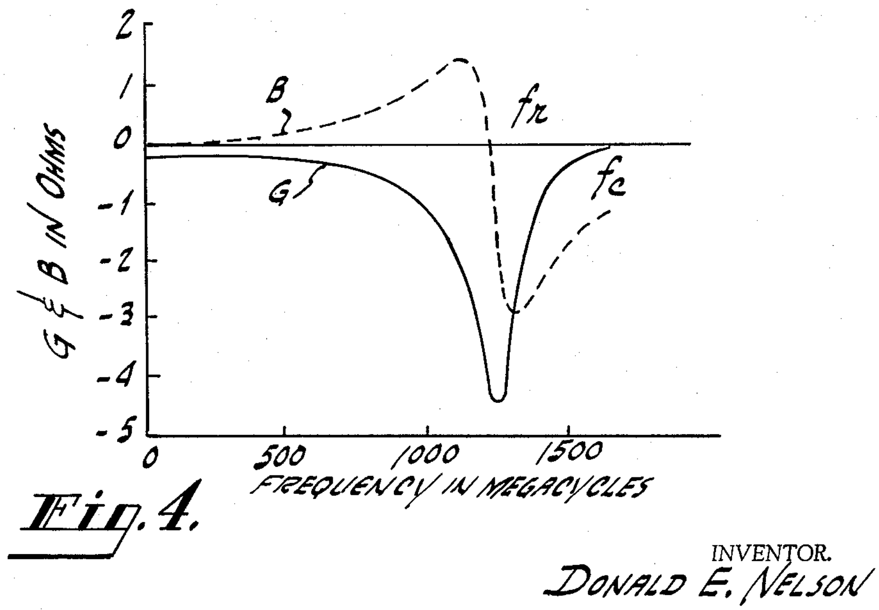
FIGURE 4 is a graph illustrating the variation with frequency of the conductance and the susceptance of encapsulated negative resistance diode.

A graph of the conductance G and susceptance B characteristics as a function of frequency of an encapsulated tunnel diode is shown in FIGURE 4. The negative values of conductance and susceptance are plotted below the axis of the abscissa and the positive values above it. The frequency $f_r$ is the self-resonating frequency of the encapsulated diode and the frequency $f_c$ is the cut-off frequency, above which the conductance of the diode becomes positive and the diode ceases to act as an active negative resistance device.

Stated briefly, in order for a tunnel diode, which is stably biased to exhibit a negative resistance, to operate in a circuit as a self-excited oscillation generator at a selected frequency, it is necessary that the net susceptance of the entire circuit equal zero at the selected frequency so that resonance occurs. Additionally, the absolute value of the initial negative conductance of the diode at the selected frequency must exceed the sum of the positive conductances presented by the other circuit components, such as the load and the biasing circuit resistance. For operation as an amplifier, the net susceptance of the circuit at the amplifier resonant frequency must equal zero but the absolute value of the negative conductance of the diode must in this case be less than the sum of the positive conductances of the circuit, which includes a generator or input circuit as well as the load and the biasing circuit.

At high frequencies, transmission lines are utilized to cancel the susceptance of the diode to provide the resonant circuit. Excessive radiation losses which would occur with lumped circuit elements is avoided. Additionally, the transformer action of a transmission line solves the difficulty of the loading presented by the bias stabilizing resistor on a tunnel diode circuit. As stated previously, the resistance presented to the diode must be lower in value than the absolute value of the minimum negative resistance of the diode. The transformer action causes the biasing resistor to present a lower conductance to the diode which reduces the R-F loading on the diode. The frequency range over which the biasing resistor presents little or no loading may be made broad. Thus the circuit may be operated as a broad band oscillator. Simultaneously a lower frequency range wherein the loading presented by the biasing resistor is very large, is also achieved in the circuit.

Referring to FIGURE 5*a*, there is shown a high frequency oscillator circuit including a re-entrant transmission line structure 30 comprising a pair of parallel conductors 32 and 34 insulated from each other by a layer of dielectric insulated material 36. A tunnel diode 38, which is similar to the one described in FIGURES 1, 2 and 3, is connected between the conductors 32 and 34, as illustrated in FIGURE 5*b*, which is a cross sectional view taken along line $5_b$—$5_b$ in FIGURE 5*a*.

The tunnel diode 38 comprises a cylindrical base 53 which is connected to the transmission line conductor 34 by means of conducting epoxy or solder, such as shown in FIGURE 5*b* at point 45. The tunnel diode includes a semiconductor wafer 41 and a tin dot 49, the junction being formed between them. The tin dot 49 is in contact with a screen 43, which in turn is connected to a small cylindrical tubular portion 51 of conducting material which may be similar to the material of conductor 32. This portion of conducting material 51 is in turn connected to the conductor 32 by conducting epoxy or solder 47 as illustrated in FIGURE 5*b*. The tunnel diode also includes a cylindrical portion 55 of conductive material, which may be similar to the transmission line conductor 34 material. The wafer 41 rests on and is soldered or otherwise electrically connected to the cylindrical portion 55 which in turn rests on and is soldered or otherwise electrically connected to the base 53. The tubular cylinder 51 is spaced from the cylindrical portion 55 by a tubular insulator, as shown.

A bias stabilizing resistor 40 is connected between the conductors 32 and 34 as shown in FIGURE 5*c*, at an arcuate distance $l_1$ measured along the transmission line from the tunnel diode 38. The resistor 40 includes a metal conductor 56 which is in contact with the transmission line conductor 34. The resistor 40 itself is connected to the conductor 32. The conductor 32 and 34 are insulated from each other by a layer of insulation 36 as shown in FIGURES 5*a*, 5*b* and 5*c*. The thickness of the conductor 32 and 34 and of the layer of insulation 36 have been greatly exaggerated for the purpose of illustration only. The stabilizing resistor 40 may be a block of germanium or graphite, for example, and is chosen to have a value of resistance that is lower than the absolute value of the minimum negative resistance of the tunnel diode 38. A biasing voltage source 42, shown schematically as a battery 44, and a variable resistor 46 connected in series with the battery, is connected between the conductors 32 and 34 at the terminals 48 and 50.

The conductor 32 is U-shaped and it forms a re-entrant transmission line by means of a sliding conductor 52 which is in contact with the arms of the conductor 32. The sliding conductor 52 is maintained in contact with the arms of the conductor 32 by any suitable means, such as spring loading or the like. The mean circumference of the re-entrant transmission line 30 is determined by the position of the sliding conductor 52. The distance $l_1$, between the negative resistance diode 38 and the biasing resistor 40, may be approximately one-quarter of the wave length at the position of the sliding conductor 52 nearest the base of the U-shaped conductor which corresponds to the highest frequency position; i.e., minimum mean circumference of the transmission line.

Output signals are coupled from the transmission line by means of a quarter wave length output transformer 54. The conductor 34 is a solid plate of conductive material and it may be the usual ground plane of microwave strip transmission lines. Both the dielectric insulating material 36 and the conductor 34 are solid except for the holes provided for the tunnel diode and the biasing resistor.

The condition for oscillation of the oscillator circuit, is that the sum of the susceptances of the circuit is equal to zero. This includes the susceptance of the circuit itself and the susceptance of the tunnel diode 38.

The susceptance of the tunnel diode, as a function of frequency, is shown in FIGURE 4. The susceptance presented by the circuit to the tunnel diode 38 is shown in FIGURE 6. The susceptance presented by the circuit has two points of zero susceptance, one corresponding to a frequency in which the mean circumference $l$ of the re-entrant transmission line is equal to one full wave length $\lambda$. As long as the sum total of the susceptances must equal zero, the frequency of oscillation of the oscillator circuit, for one setting of the sliding conductor 52, will not be exactly the point corresponding to the mean circumference $l$ of the transmission line, but it will be a point in which the added susceptance of the diode will be cancelled.

The susceptance B of the tunnel diode should be taken in consideration in the design of the circuit. However, for practical purposes the frequency of oscillation of the circuit is approximately equal to the mean circumference $l$ of the transmission line which in turn represents one full wave length.

The range of oscillations is then determined by the position of the sliding conductor 52. The maximum frequency of operation corresponding to the minimum mean circumference $l$ of the transmission line. The distance between the tunnel diode 38 and the resistor 40 corresponding to the point of maximum frequency of operation is equal to an arcuate distance $l_1$ which for the purpose of simplicity will be chosen to be one-quarter wave length.

As the sliding conductor 52 is moved towards the end of the U-shaped conductor 32, the mean circumference $l$ of the transmission line increases and hence the frequency of operation is decreased. The distance $l_1$ in wave lengths also decreases and the loading presented by the resistor to the tunnel diodes varies.

In order to determine the variation of the loading presented to the tunnel diode as the frequency of oscillation is varied, i.e., as the conductor 52 is moved to different positions, the following equation (which represents the normalized admittance presented to the tunnel diode 38 by the circuit) should be employed:

$$\frac{Y}{Y_0}=\frac{B^2}{A^2+\left(\frac{Z_0}{R}\right)^2}\frac{Z_0}{R}+jA\left[\frac{B^2}{A^2+\left(\frac{Z_0}{R}\right)^2}\right]$$

where $R$=to the resistance of the stabilizing resistor 40;
$Y_0$=the characteristic admittance of the transmission line 30;
$l_1$=the distance from the tunnel diode 38 to the stabilizing resistor 40 in one direction;
$l_2$=the distance from the tunnel diode 38 to the stabilizing resistor 40 in the opposite direction;
$A$=cotangent $\beta l_1$+cotangent $\beta l_2$;
$B$=cosecant $\beta l_1$+cosecant $\beta l_2$;
$\beta$=the phase constant of the transmission line 30.

The above equation provides the mathematical foundation for the curves shown in FIGURE 6.

In order to explain the operation of the circuit the normalized susceptance and the normalized conductance presented by the circuit to the tunnel diode for two different settings of the conductor 52 are plotted respectively in FIGURES 6 and 7.

The sliding conductor 52 may be set at the position corresponding to maximum frequency of oscillation. The normalized curves of FIGURE 6 are for this condition. Also, at this position the distance $l_1$ between the tunnel diode 38 and the resistor 40 is taken equal to one-quarter wave length.

In FIGURE 6 the normalized susceptance $B/Y_0$ presented to the diode is plotted against $l/\lambda$ where $l$ is the mean circumference of the transmission line. This susceptance is equal to zero at $l/\lambda$=.5 and also at $l/\lambda$=1.0. The normalized conductance $G/Y_0$ plotted against the same abscissae has a value equal to zero at the point $l/\lambda$=1.0. The conductance exhibited to the diode by the circuit is very low over a wide range of frequencies centered about the frequency where the mean circumference $l$ is equal to one wave length. This region is designated by the letter N in FIGURE 6. The conductance of the circuit, however, is very high over a somewhat narrow range centered about a frequency which is half the value of the frequency of minimum conductance. This region is designated by the letter H in the graph.

When the tunnel diode is included in the circuit, due to the susceptance of the tunnel diode the $l/\lambda=1.0$ point of zero susceptance shifts. This means that the loading presented by the circuit is no longer zero. If the new point of oscillation is within the region N, as shown by the conductance graph illustrated in FIGURE 6, the load presented by the circuit is small.

The graph shown in FIGURE 7 illustrates the normalized conductance characteristic presented by the circuit to the tunnel diode for a second position of the sliding conductor 52, which corresponds to a larger mean circumference $l$. Hence, the distance $l_1$ is smaller than one-quarter wave length. The points of zero susceptance of the circuit correspond to the points $l/\lambda=.75$ and $l/\lambda=.38$. However, the zero conductance points are then $l/\lambda=1.0$, and $l/\lambda=.75$. The high conductance region is centered about the point corresponding to $l/\lambda=.37$.

As previously explained, because of the intrinsic reactance of the tunnel diode the point of oscillation of the oscillator circuit does not correspond to the zero susceptance point of the transmission line, but as long as the shift in the point is within the region N, the loading presented to the tunnel diode is very small.

It should be understood that the frequency range of the oscillator circuit has been described to have an upper limit corresponding to a point wherein the distance between the diode and the resistor is one-quarter wave length as a matter of convenience only. The point of maximum frequency may correspond to a distance $l_1$ which is larger than one-quarter wave length and hence the frequency range may be extended. Also, the frequency range may be adjusted by trimming the arms of the U-shaped conductor 32, as shown in FIGURE 5.

What is claimed is:

1. A high frequency circuit comprising in combination;

a transmission line structure including a pair of conductors, one of said conductors having a U-shape and including a sliding contact connected across the arms of the U-shaped conductor to form a closed loop;

an active element comprising a voltage controlled negative resistance device coupled between the closed loop portion of said one conductor and the other conductor;

a resistor coupled between said transmission line conductors at a spaced arcuate distance from said negative resistance device;

and means connected across said conductors for biasing said device to exhibit a negative resistance.

2. In combination;

a re-entrant transmission line including a pair of parallel conductors, one of said conductors having a U-shape and including a tuning conductor connected across the arms of said one conductor to form a closed loop, said tuning conductor being movable along the arms of said U-shaped conductor to vary the mean circumference along said re-entrant transmission line;

an active element comprising a voltage controlled negative resistance device connected between the closed loop portion of said one conductor and the other conductor, and resistive means connected across said transmission line at a spaced arcuate distance from said negative resistance device for receiving a bias voltage to bias said device to exhibit a negative resistance.

3. A high frequency oscillator circuit comprising in combination, a resonant re-entrant transmission line including a pair of conductors, one of said conductors having a U-shape and a sliding stub connected across the arms of said U-shaped conductor to form a closed loop, the position of said stub determining the mean circumference of said transmission line;

a voltage controlled negative resistance diode connected between the closed loop portion of said one conductor and the other conductor;

a resistor connected across said transmission line at spaced circumferential distance from said diode, said resistor having a resistance smaller than the absolute value of minimum negative resistance of said diode; and means connected across said diode for biasing said diode to exhibit a negative resistance.

4. A high frequency oscillator circuit having a broad frequency band of operation comprising, a transmission line including a pair of parallel conductors, one of said conductors having a U-shape including a sliding stub connected across the arms of said U-shaped conductor to form a closed loop, the position of said sliding stub determining the frequency of oscillation of said oscillator circuit;

an active element comprising a negative resistance diode connected between the closed loop portion of said one conductor and the other conductor;

a resistor connected across said transmission line conductors at any spaced arcuate distance from said diode, said resistor having a resistance smaller than the absolute value of the minimum negative resistance of said diode; and means connected across said conductors for biasing said diode to exhibit a negative resistance.

5. A high frequency circuit having a predetermined mean oscillating frequency comprising in combination a resonant transmission line including a pair of conductors, one of said conductors having a U-shape;

a voltage controlled negative resistance device connected across said transmission line;

a resistor connected across said transmission line at an arcuate distance from said negative resistance device;

means connected across said negative resistance device for biasing said device to exhibit a negative resistance; and tuning means connected across the arms of said U-shape conductor for completing a current path between said arms of said one conductor, said tuning means determining the oscillating frequency of said negative resistance device as a function of the position of said tuning means along the arms of said U-shaped conductor, said negative resistance device being positioned within the circumferential area defined by said current path.

6. An oscillator circuit comprising;

first and second conductors parallel to each other and being insulated from each other by a layer of dielectric, said first conductor having a U-shape;

a third conductor connected across the arms of said first conductor to form a re-entrant transmission line;

said third conductor being movable along the arms of said first conductor to vary the mean circumference of said transmission line and thereby vary the oscillation frequency of said oscillator circuit;

a tunnel diode connected between said first and second conductors inside the circumference of said re-entrant transmission line to operate as the active element of said oscillator circuit;

a resistor connected between said first and second conductors at a distance from said tunnel diode equal to one-quarter wave length of the frequency of operation for the minimum mean circumference of said re-entrant transmission line, said resistor having a value that is smaller than the absolute value of the minimum negative resistance value of said tunnel diode; and means connected across said resistor for biasing said diode to exhibit a negative resistance.

References Cited by the Examiner

UNITED STATES PATENTS 3,127,574 3/1964 Sommers ----------- 331—107

OTHER REFERENCES

"A New Type of VHF Tank Design," Parker, FM–TV, vol. 9, No. 10, pp. 14–15, October 1949.

ROY LAKE, *Primary Examiner.*

JOHN KOMINSKI, *Examiner.*

J. B. MULLINS, *Assistant Examiner.*